United States Patent
Kamins et al.

(10) Patent No.: US 7,465,954 B2
(45) Date of Patent: Dec. 16, 2008

(54) NANOWIRE DEVICES AND SYSTEMS, LIGHT-EMITTING NANOWIRES, AND METHODS OF PRECISELY POSITIONING NANOPARTICLES

(75) Inventors: Theodore I Kamins, Palo Alto, CA (US); Philip J Kuekes, Palo Alto, CA (US); Stanley Williams, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/413,375

(22) Filed: Apr. 28, 2006

(65) Prior Publication Data

US 2007/0252132 A1  Nov. 1, 2007

(51) Int. Cl.
*H01L 29/06* (2006.01)

(52) U.S. Cl. .............. 257/13; 257/12; 257/94; 257/95; 257/96; 977/752; 977/762; 977/949; 977/950

(58) Field of Classification Search .......... 257/12, 257/13, 94–96; 977/752, 762, 949, 950
See application file for complete search history.

(56) References Cited

U.S. PATENT DOCUMENTS

| | | | |
|---|---|---|---|
| 6,128,214 A | 10/2000 | Kuekes et al. | |
| 6,383,923 B1 | 5/2002 | Brown et al. | |
| 6,465,132 B1 | 10/2002 | Jin | |
| 6,882,051 B2 | 4/2005 | Majumdar et al. | |
| 6,996,147 B2 | 2/2006 | Majumdar et al. | |
| 7,014,737 B2 | 3/2006 | Harutyunyan et al. | |
| 2002/0175408 A1* | 11/2002 | Majumdar et al. | ......... 257/734 |
| 2003/0089899 A1 | 5/2003 | Lieber et al. | |
| 2004/0075464 A1 | 4/2004 | Samuelson et al. | |
| 2004/0082178 A1 | 4/2004 | Kamins et al. | |
| 2004/0106203 A1 | 6/2004 | Stasiak et al. | |
| 2004/0213307 A1* | 10/2004 | Lieber et al. | ................. 372/39 |
| 2005/0133476 A1 | 6/2005 | Islam et al. | |
| 2005/0181587 A1* | 8/2005 | Duan et al. | ................. 438/551 |
| 2005/0253138 A1* | 11/2005 | Choi et al. | .................... 257/40 |
| 2006/0056463 A1* | 3/2006 | Wang et al. | .................... 372/3 |

OTHER PUBLICATIONS

Hennessy, K., et al., "Positioning photonic crystal cavities to single InAs quantum dots," Photonics and Nanostructures—Fundamentals and Applications 2, pp. 65-72, 2004.

(Continued)

*Primary Examiner*—Cuong Q Nguyen
*Assistant Examiner*—Trang Q Tran

(57) ABSTRACT

A radiation-emitting device includes a nanowire that is structurally and electrically coupled to a first electrode and a second electrode. The nanowire includes a double-heterostructure semiconductor device configured to emit electromagnetic radiation when a voltage is applied between the electrodes. A device includes a nanowire having an active longitudinal segment selectively disposed at a predetermined location within a resonant cavity that is configured to resonate at least one wavelength of electromagnetic radiation emitted by the segment within a range extending from about 300 nanometers to about 2,000 nanometers. Active nanoparticles are precisely positioned in resonant cavities by growing segments of nanowires at known growth rates for selected amounts of time.

16 Claims, 12 Drawing Sheets

OTHER PUBLICATIONS

Islam, M. Saif, et al., "A novel interconnection technique for manufacturing nanowire devices," Appl. Phys. A, vol. 80, pp. 1133-1140, 2005.

Islam, M. Saif, et al., "Ultrahigh-density silicon nanobridges formed between two vertical silicon surfaces," Nanotechnology 15, pp. L5-L8, 2004.

Joannopoulos, John D., et al., "Photonic Crystals, Molding the Flow of Light," Appendix D, pp. 127-129, Princeton University Press, 1995.

Kuykendall, Tevye, et al., "Crystallographic alignment of high-density gallium nitride nanowire arrays." Nature Materials/Advance Online Publication/www.nature.com/naturematerials, pp. 1-5, 2004.

Sharma, S., et al., "Structural characteristics and connection mechanism of gold-catalized bridging silicon nanowires," Journal of Crystal Growth, vol. 280, pp. 562-568, 2005.

US 6,780,301, 08/2004, Natan et al. (withdrawn)

* cited by examiner

NANOWIRE DEVICES AND SYSTEMS, LIGHT-EMITTING NANOWIRES, AND METHODS OF PRECISELY POSITIONING NANOPARTICLES

FIELD OF THE INVENTION

The present invention relates devices and systems that include nanowires. More particularly, the present invention relates to light-emitting nanowires, devices and systems including nanowires positioned within resonant cavities, and methods for precisely positioning nanoparticles within resonant cavities using nanowires.

BACKGROUND OF THE INVENTION

Nanotechnology is concerned with the fabrication and application of materials, structures, devices, and systems at the atomic and molecular level. Nanotechnology typically is concerned with structures and devices having elements or features that are less than about 100 nanometers in size. At these dimensions, such structures and devices often exhibit novel and significantly improved physical, chemical, and biological properties, phenomena, and processes due to their extremely small size. The behavior of such structures and devices may not be predictable based on the behavior exhibited by larger, but otherwise identical structures and devices. Nanotechnology is currently making significant contributions to the fields of computer storage, semiconductors, biotechnology, manufacturing and energy.

Nanowires are fundamental structures that are often used in nan-scale structures and devices. Nanowires are wire-like structures that typically have diameters of less than about 100 nanometers. In addition to functioning as conventional wires for interconnection applications, nanowires have a wide variety of other potential applications. Recently, devices and systems such as field-effect transistors, radiation detectors, light emitting diodes, lasers, and sensors have been described that employ nanowires in their design.

Many nanowires described in the art include conventional semiconductor materials such as silicon-based materials and germanium-based materials.

One method of forming such nanowires is the vapor-liquid-solid (VLS) chemical synthesis process. Generally, this method involves depositing particles of a catalyst material such as gold or titanium on a surface of a structure on which it is desired to grow nanowires. The structure is provided within a chamber and heated to temperatures typically ranging between about 500° C. and about 1000° C. Precursor gasses that include elements that will be used to form the nanowires are introduced into the chamber. The particles of catalyst material cause the precursor gasses to at least partially decompose into their respective elements, some of which are transported on or through the particles of catalyst material and deposited on the underlying surface. As this process continues, a nanowire is formed or grown with the catalyst particle remaining on the growing tip or end of the nanowire.

Nanowires that include a heterogeneous structure have also been described in the art. For example, longitudinal heterostructure nanowires (LOHN) have been described in which the composition of the nanowire varies along the longitudinal length thereof. Similarly, coaxial heterostructure nanowires (COHN) have been described in which the composition of the nanowire varies in the radial direction. Nanowires that include such heterogeneous structures have been described that include multiple regions of doped semiconductor materials that form pn, pnp, and npn junctions.

Many areas of technology, such as optical signal processing for example, employ light-emitting diodes (LED's) and laser devices such as vertical cavity surface emitting lasers (VCSEL's) that include active or gain material disposed within a resonant cavity. The resonant cavity may be used to ensure that the spectral line width of the light emitted by the active material is narrow and to provide emitted light having high directivity. Quantum dots that are formed from active material have been provided within resonant cavities to provide such light-emitting diodes and laser devices. One challenge to optimizing the performance of such devices, however, has been the inability to precisely control the position of such quantum dots within the resonant cavity. Therefore, there is a need in the art for methods of precisely positioning quantum dots within resonant cavities.

BRIEF SUMMARY OF THE INVENTION

In one aspect, the present invention includes a radiation-emitting device having at least one nanowire extending between a first electrode and a second electrode. The nanowire is structurally and electrically coupled to the electrodes and includes a double-heterostructure semiconductor device configured to emit electromagnetic radiation when a voltage is applied across the nanowire between the electrodes.

In another aspect, the present invention includes a device having a nanowire disposed within a resonant cavity. The nanowire has an active longitudinal segment capable of emitting electromagnetic radiation at a wavelength of electromagnetic radiation within a range extending from about 300 nanometers to about 2,000 nanometers. The active longitudinal segment of the nanowire is selectively disposed at a predetermined location within the resonant cavity, and the resonant cavity is configured to resonate the radiation emitted by the active longitudinal segment of the nanowire.

In yet another aspect, the present invention includes a method for precisely positioning an active nanoparticle within a resonant cavity. A structure is provided that includes a resonant cavity configured to resonate at least one wavelength of electromagnetic radiation. A first longitudinal segment of a nanowire having a first composition is grown that extends from a surface of the structure adjacent the resonant cavity. The first longitudinal segment is grown at a known growth rate for a selected amount of time. A second active longitudinal segment of the nanowire that includes an active nanoparticle is grown that extends from an end of the first longitudinal segment. The second active longitudinal segment has an active second composition that is configured to emit electromagnetic radiation at the at least one wavelength upon stimulation.

The features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

As used herein, the term "active material" means material that is capable of emitting electromagnetic radiation upon stimulation. The phrase "III-V type semiconductor material" means any material that is substantially composed of an element or elements from group IIIB of the periodic table (B, Al, Ga, In, and Ti) and an element or elements from group VB of the periodic table (N, P, As, Sb, and Bi). The phrase "II-VI type semiconductor material" means any material that is substantially composed of an element or elements from group IIB of the periodic table (Zn, Cd, and Hg) and an element or elements from group VIB of the periodic table (O, S, Se, Te, and Po).

As used herein, the term "heterojunction" means a junction between two regions of semiconductor material that have different bandgap energies. In other words, the bandgap energy on a first side of a heterojunction is different from a bandgap on the opposite, second side of the heterojunction. The phrase "double-heterostructure semiconductor device" means a semiconductor device that includes at least two heterojunctions.

Figure 1:
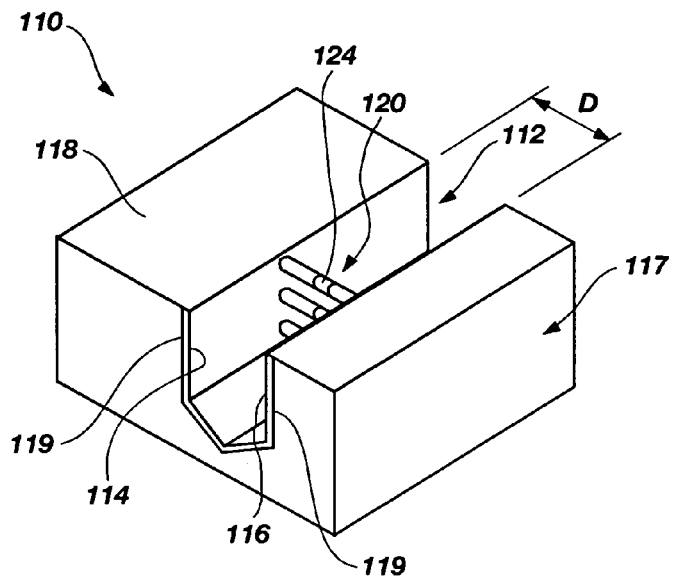
FIG. 1 is a perspective view of an embodiment of a device of the present invention that includes a nanowire disposed within a resonant cavity.

An embodiment of a device 110 of the present invention is shown in FIG. 1. The device 110 includes a resonant cavity 112 and a plurality of nanowires 120 disposed within the resonant cavity 112. Each nanowire 120 may include an active longitudinal segment 124 that comprises an active material. The active longitudinal segment 124 of each nanowire 120 may be substantially composed of active material that is capable of emitting electromagnetic radiation at a selected, predetermined wavelength upon stimulation. Such stimulation may be provided by, for example, irradiating the active material with electromagnetic radiation having a particular wavelength (often referred to as "optical pumping"). Alternatively, such stimulation may be provided by electrically stimulating the material. For example, a voltage may be applied across the active material to electrically stimulate the active material.

The selected, predetermined wavelength of electromagnetic radiation emitted by the active material may be, for example, within a range extending from about three-hundred (300) nanometers to about two-thousand (2,000) nanometers. The resonant cavity 112 may be configured to resonate the selected, predetermined wavelength of electromagnetic radiation that is emitted by the active material in the active longitudinal segment 124 of each nanowire 120.

The active longitudinal segment 124 of each nanowire 120 may be selectively disposed at a predetermined location within the resonant cavity 112. Furthermore, the active longitudinal segment 124 of each nanowire 120 may comprise or behave as an active quantum dot.

By way of example and not limitation, the resonant cavity 112 may be formed in a substrate 117. The substrate 117 may be substantially transparent to the selected, predetermined wavelength of electromagnetic radiation emitted by the active material in the active longitudinal segment 124 of each nanowire 120. The resonant cavity 112 may include or be formed in an aperture, groove, channel, or trench extending at least partially through the substrate 117. In the embodiment shown in FIG. 1, a trench has been formed in a substantially planar surface 118 of the substrate 117 to provide opposing, substantially parallel vertical sidewalls 119. The substrate 117 may include silicon (Si).

The active material of the active longitudinal segment 124 of each nanowire 120 may include, for example, silicon (Si), a silicon-based material, germanium (Ge), a germanium-based material, a material doped with erbium ($Er^{3+}$) ions, a II-V type semiconductor material, or a II-VI type semiconductor material. Some III-V type semiconductor materials that may be used as active material include, but are not limited to, GaAs, $Al_xGa_{1-x}As$ (where x is in a range extending from about 0 to about 0.4), $In_{1-x}Ga_xAs_{1-y}P_y$ (where x is in a range extending from about 0 to about 0.47 and y is equal to about 2.2 times x), InGaN alloys, $In_{0.49}Al_xGa_{0.51-x}P$, $Ga\ As_{1-y}P_y$ (where y is less than about 0.45), $Ga\ As_{1-y}P_y$ doped with N, Zn, or O (where y is greater than about 0.45), GaP doped with Zn or O, and GaP doped with N. Some II-VI type semiconductor materials that may be used as active material include, but are not limited to, ZnO and CdS.

The resonant cavity 112 of the device 110 may comprise a Fabry-Perot resonant cavity. A Fabry-Perot resonant cavity may be formed by, for example, providing two parallel reflective members separated from one another by a distance. When electromagnetic radiation is reflecting back and forth between the two reflective members, the reflecting waves may interfere constructively or destructively. When the distance separating the reflective members is equal to an integer multiple of one-half the wavelength of the reflecting electromagnetic radiation (i.e., $D=n\lambda/2$, where D is the distance between the reflective members, n is an integer, and $\lambda$ is the wavelength of the electromagnetic radiation), the waves of reflecting electromagnetic radiation may interfere constructively, causing the electromagnetic radiation to resonate within the cavity. When the distance separating the reflective members is not equal to an integer multiple of one-half the wavelength of the radiation (i.e., $D \neq n\lambda/2$), the waves of reflecting electromagnetic radiation may interfere destructively, thereby dissipating the reflecting electromagnetic radiation within the cavity.

By way of example and not limitation, the resonant cavity 112 of the device 110 may include a first reflective member 114 and a second reflective member 116. The first reflective member 114 and the second reflective member 116 each may be substantially planar. The second reflective member 116 may be oriented substantially parallel to the first reflective member 114, and the second reflective member 116 may be separated from the first reflective member 114 by a selected distance D. Furthermore, the first reflective member 114 and the second reflective member 116 each may have a reflectivity greater than zero with respect to the selected, predetermined wavelength of electromagnetic radiation that may be emitted by the active material of the active longitudinal segment 124 of each nanowire 120. One of the first reflective member 114 and the second reflective member 116 may have a reflectivity of about one-hundred (100) percent with respect to the selected, predetermined wavelength of electromagnetic radiation that may be emitted by the active material of the active longitudinal segment 124 of each nanowire 120. The other reflective member may have a reflectivity of less than one-hundred (100) percent to allow at least some electromagnetic radiation emitted by the active material of the active longitudinal segment 124 of each nanowire 120 to escape from the resonant cavity 112 therethrough.

The first reflective member 114 and the second reflective member 116 each may include a substantially planar thin layer of reflective material. By way of example and not limitation, the first reflective member 114 and the second reflective member 116 each may include a substantially planar thin layer of silver disposed on the opposing, substantially parallel vertical sidewalls 119 of the trench formed in the substrate 117. In one embodiment, the first reflective member 114 and the second reflective member 116 each may have a thickness of less than about fifty (50) nanometers. For example, the first reflective member 114 may have a thickness of about thirty (30) nanometers and a reflectivity of about one-hundred (100) percent with respect to at least one wavelength of electromagnetic radiation emitted by the active material of the active longitudinal segment 124 of each nanowire 120, and the second reflective member 116 may have a thickness of about five (5) nanometers and a reflectivity of less than one-hundred (100) percent with respect to the selected, predetermined wavelength of electromagnetic radiation that may be emitted by the active material of the active longitudinal segment 124 of each nanowire 120. In this configuration, when electromagnetic radiation is emitted by the active material of the active longitudinal segment 124 of each nanowire 120, at least some of the radiation may reflect back and forth between the first reflective member 114 and the second reflective member 116 and resonate within the resonant cavity 112. At least some of the resonating electromagnetic radiation may pass through the second reflective member 116.

In alternative embodiments, the vertical sidewalls 119 of the trench extending at least partially through the substrate 117 may have a reflectivity greater than zero with respect to the selected, predetermined wavelength of electromagnetic radiation that may be emitted by the active material of the active longitudinal segment 124 of each nanowire 120. In this configuration, the first reflective member 114 and the second reflective member 116 of the resonant cavity 112 may include the surfaces of the vertical sidewalls 119 of the trench, and no thin layer of reflective material need be applied to the surfaces of the vertical sidewalls 119.

Figure 2:
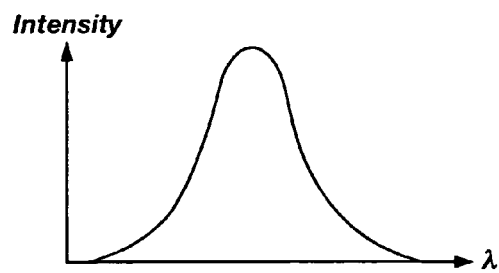
FIGS. 2-3 are graphs of emission spectra illustrating principles of operation of the device shown in FIG. 1.
Figure 3:
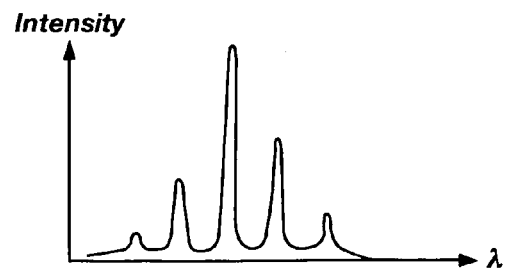

The emission spectrum of the electromagnetic radiation emitted by the active material of the active longitudinal segment 124 of each nanowire 120 within the resonant cavity 112 may be similar to that illustrated in FIG. 2. The emission spectrum of the electromagnetic radiation passing through the second reflective member 116 may be similar to that illustrated in FIG. 3. The emission peaks shown in FIG. 3 correspond to the resonant wavelengths of the resonant cavity 112. The wavelengths of electromagnetic radiation between the peaks may be substantially dissipated within the resonant cavity 112 due to destructive interference, as previously described.

The active longitudinal segment 124 of each nanowire 120 may be selectively disposed at a predetermined location within the resonant cavity 112 of the device 110. For example, the active longitudinal segment 124 of each nanowire 120 may be selectively disposed at a predetermined location within the resonant cavity 112 of the device 110 to maximize the energy within the resonant cavity 112 when the active material of the active longitudinal segment 124 of each nanowire 120 is emitting electromagnetic radiation.

In alternative embodiments, at least one of the first reflective member 114 and the second reflective member 116 may be convex. In other embodiments, at least one of the first reflective member 114 and the second reflective member 116 may include a Bragg mirror.

Moreover, both the first reflective member 114 and the second reflective member 116 may have a reflectivity of less than one-hundred (100) percent to allow at least some electromagnetic radiation emitted by the active material of the active longitudinal segment 124 of each nanowire 120 to escape from the resonant cavity 112 through both the first reflective member 114 and the second reflective member 116. Alternatively, both the first reflective member 114 and the second reflective member 116 may have a reflectivity of about one-hundred (100) percent.

In the embodiment illustrated in FIG. 1, the first reflective member 114 and the second reflective member 116 are disposed on the vertical sidewalls 119 of the trench formed in the substrate 117. In other embodiments, the first reflective member 114 and the second reflective member 116 may be disposed at the opposing longitudinal ends of the trench formed in the substrate 117. For example, thin layers of reflective material may be provided on the sides of the substrate 117 that are intersected by the trench. The trench may be formed in the substrate 117 between the thin layers of reflective material, such that the thin layers of reflective material provide and define the longitudinal ends of the trench. In such a configuration, the electromagnetic radiation emitted by the active material of the active longitudinal segment 124 of each nanowire 120 may reflect back and forth between the thin layers of reflective material in the longitudinal direction within the trench.

A method for fabricating the device 110 shown in FIG. 1, and for selectively locating the active longitudinal segment 124 of each nanowire 120 within the resonant cavity 112 will now be described with reference to FIGS. 4A-4I.

Figure 4A:
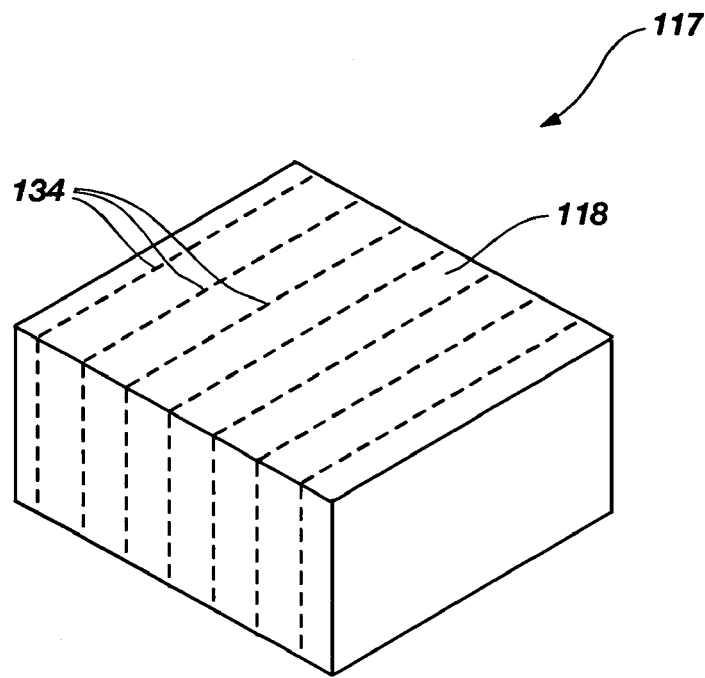
FIGS. 4A-4I illustrate a method of fabricating the device illustrated in FIG. 1.

Referring to FIG. 4A, a silicon substrate 117 may be provided. The silicon substrate 117 may include substantially crystalline silicon. The substrate 117 may include a substantially planar surface 118. The crystal structure of the silicon may be oriented such that the substantially planar surface 118 comprises a (110) plane of the silicon crystal lattice. In this configuration, the (111) planes 134 (represented in FIG. 4A by dashed lines) are oriented substantially perpendicular to the substantially planar surface 118.

Figure 4B:
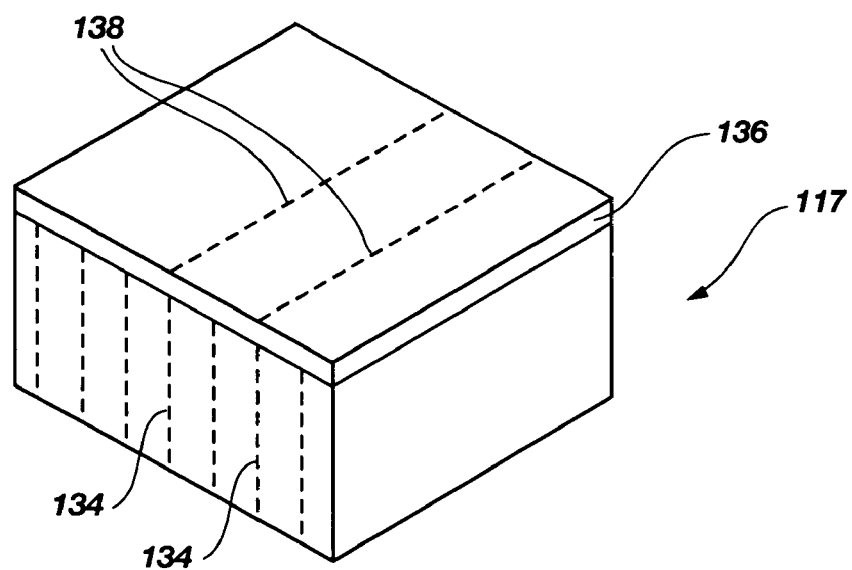

A trench that extends at least partially through the substrate 117 may be formed in the substantially planar surface 118 of the substrate 117. In one method of forming the trench, a masking and etching process may be used. As shown in FIG. 4B, a mask 136 may be formed on or in the surface 118 of the substrate 117. By way of example and not limitation, the mask 136 may include an oxide layer such as a layer of silica ($SiO_2$). Alternatively, the mask 136 may include a layer of polymer material. A portion of the mask 136 between the dashed lines 138 may be removed to expose a portion of the underlying surface 118 of the silicon substrate 117, thereby forming the structure shown in FIG. 4C. Each dashed line 138 (FIG. 4B) may be substantially disposed within or oriented parallel to a (111) plane 134 of the silicon crystal lattice. The portion of the mask 136 between the dashed lines 138 may be removed by, for example, electron beam lithography, focused ion beam lithography, or by a masking and etching process. Etching processes include but are not limited to, reactive ion etching processes and wet chemical etching processes.

In one particular method, the portion of the mask 136 between the dashed lines 138 may be removed by covering the mask 136 with a second mask (not shown), patterning the second mask to expose the portion of the mask 136 between the dashed lines 138, and etching the portion of the mask 136 between the dashed lines 138 with a reactive ion etching process using $CHF_3$ and Ar gases.

Figure 4C:
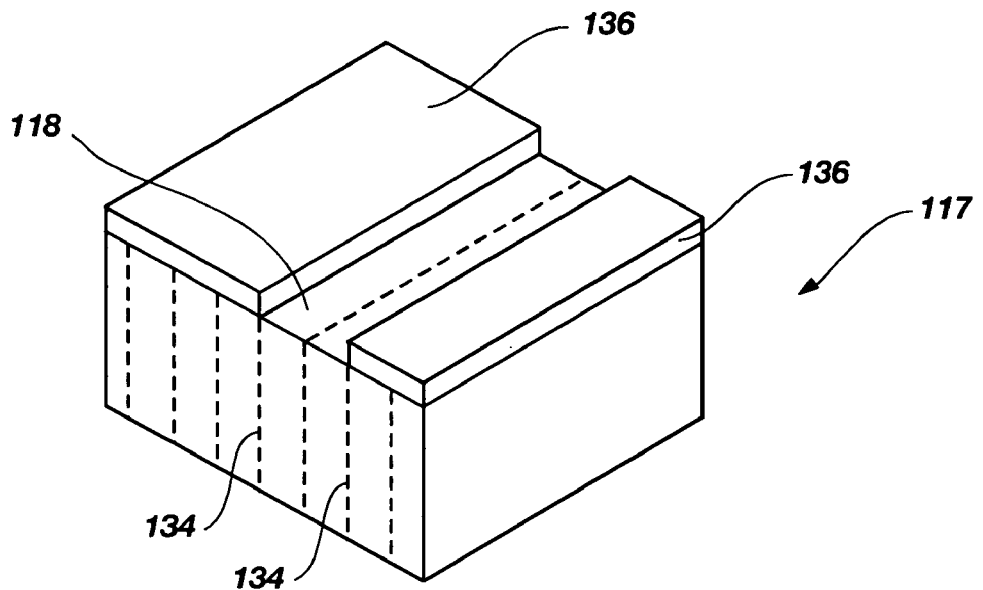
Figure 4D:
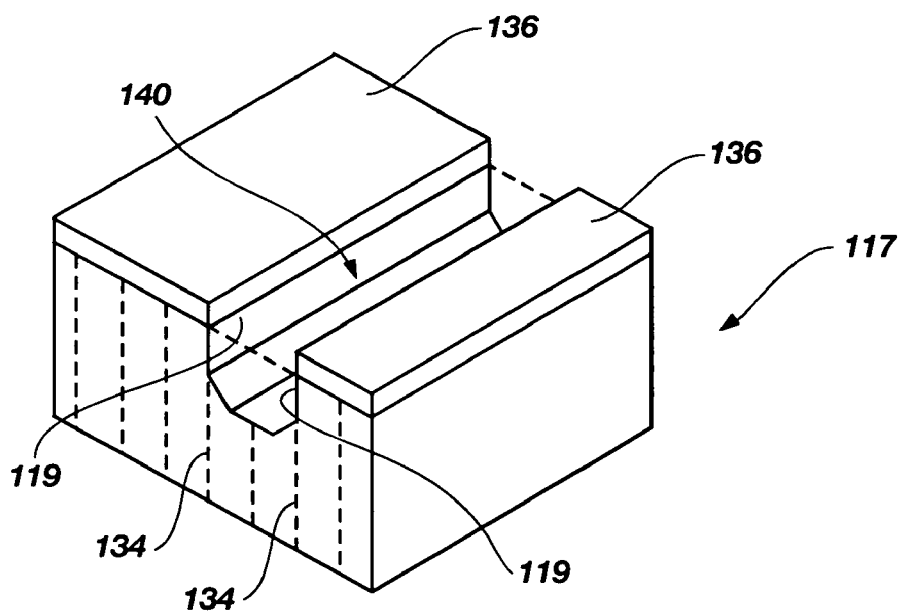
Figure 4E:
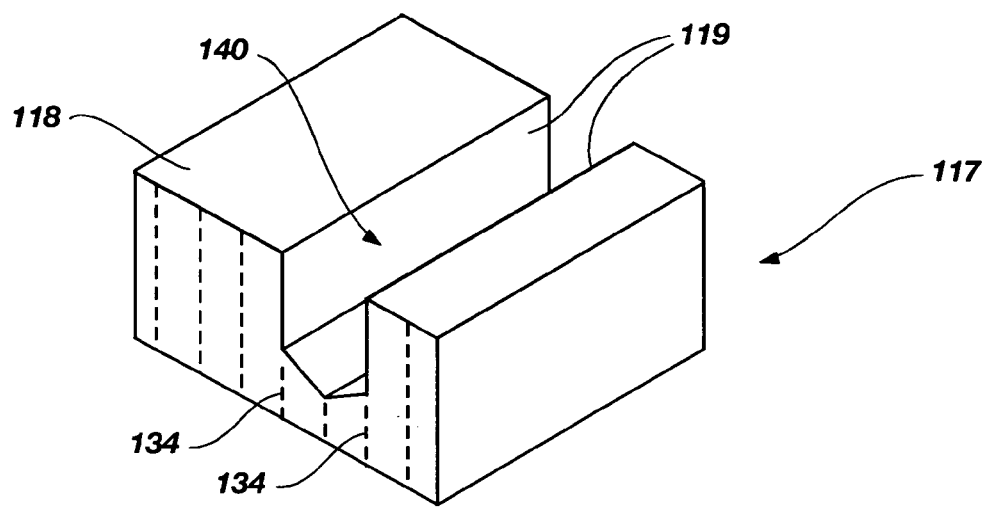

The exposed portion of the underlying surface 118 of the silicon substrate 117 shown in FIG. 4C may be etched to form a trench 140 in the substantially planar surface 118 of the substrate 117 that extends at least partially through the substrate 117, as shown in FIG. 4D. The exposed portion of the underlying surface 118 (FIG. 4C) of the silicon substrate 117 may be etched using an etchant that will etch the exposed silicon at a rate that is faster than a rate at which the etchant will etch the mask 136. Therefore, the mask 136 may include any material that will be etched slower than the exposed silicon by a particular etchant. By way of example and not limitation, if the mask 136 includes silica ($SiO_2$), the exposed portion of the underlying surface 118 of the silicon substrate 117 may be etched using a mixture of potassium hydroxide (KOH) and water (about 44% KOH). If the underlying silicon substrate 117 is etched using such a mixture at a temperature of about 110° C. for about one minute, the resulting trench 140 may have a maximum depth of approximately 8 microns. Other etchants, such as, for example, ethylene diamine pyrocatechcol (EDP), may be used to etch the trench 140 in the silicon substrate 117.

Referring to FIG. 4D, the trench 140 may provide and define opposing, vertical sidewalls 119 that are substantially parallel to one another. Each opposing, vertical sidewall 119 may include or consist of a (111) plane 134 of the silicon crystal lattice. The mask 136 then may be removed to provide the structure shown in FIG. 4E.

By way of example only and not limitation, the figures provided herein show the trench 140 as having a generally V-shaped bottom. The bottom of the trench 140 may have other shapes. The shape of the bottom of the trench 140 may be at least partially dependent on factors including the width of the trench 140 being etched and the method of etching. For example, the trench 140 may have a generally U-shaped bottom or a substantially planar bottom. As such, the illustrations are not intended to limit the scope of any embodiment of the present invention as described herein.

Figure 4F:
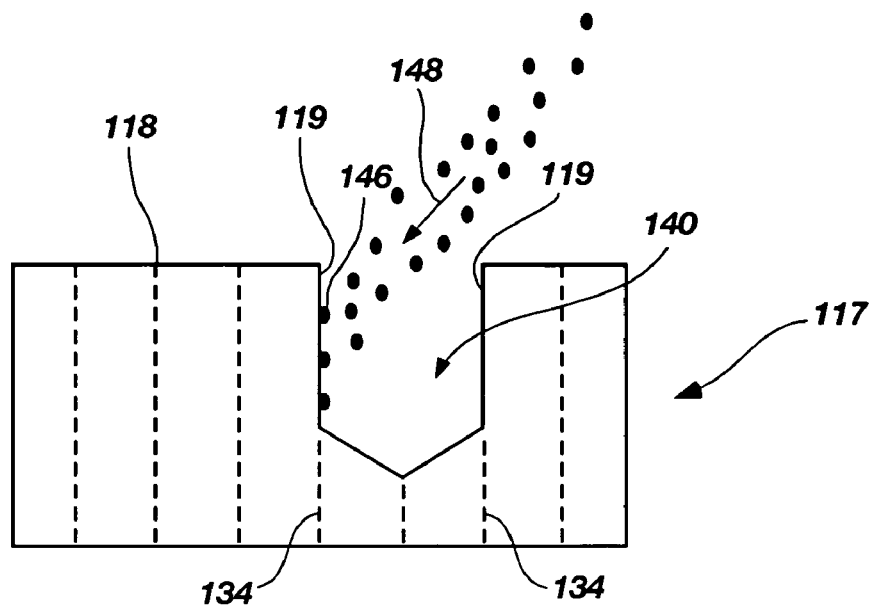
Figure 4G:
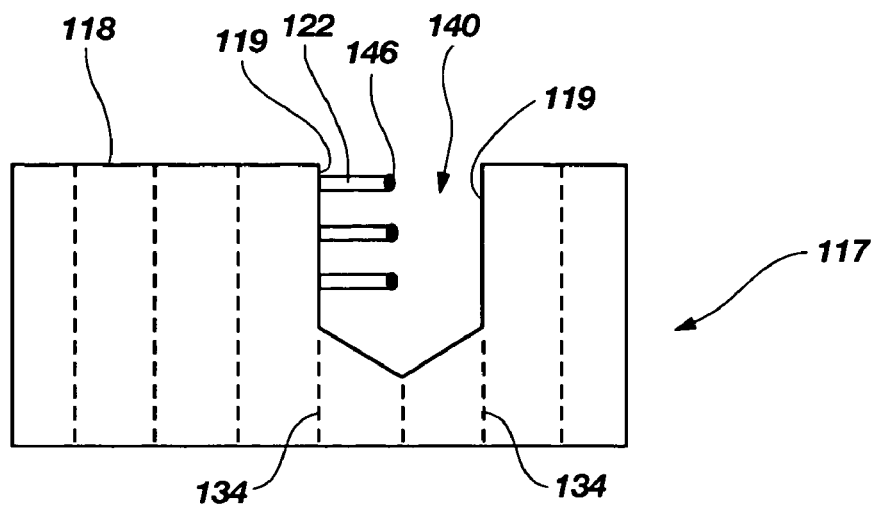

The nanowires 120 shown in FIG. 1 may be grown or formed between the opposing, vertical sidewalls 119 of the trench 140. By way of example and not limitation, the nanowires 120 may be grown using a vapor-liquid-solid (VLS) reaction or mechanism. A plurality of nanoparticles 146 comprising a catalyst material may be deposited on at least one of the opposing, vertical sidewalls 119 of the trench 140, as shown in FIG. 4F. By way of example and not limitation, the catalyst material may include metals such as titanium (Ti), gold (Au), iron (Fe), cobalt (Co), and gallium (Ga), alloys of such metals, and nonmetals such as $SiO_x$ (where x is within a range from about 1 to about 2).

Furthermore, the nanoparticles 146 may be selectively deposited on at least one of the opposing, vertical sidewalls 119 of the trench 140. For example, the nanoparticles 146 may be selectively deposited on one of the sidewalls 119 of the trench 140 but not on the opposing sidewall 119. Furthermore, the nanoparticles 146 may be selectively deposited at selected, predetermined locations on at least one of the opposing, vertical sidewalls 119 of the trench 140. The nanowires 120 (FIG. 1) will grow at the locations on the vertical sidewalls 119 where the nanoparticles 146 are disposed. Therefore, the nanowires 120 (FIG. 1) may be attached to selected, predetermined locations on the vertical sidewalls 119 by disposing the nanoparticles 146 at selected, predetermined locations on at least one of the opposing, vertical sidewalls 119 of the trench 140.

With continued reference to FIG. 4F, the nanoparticles 146 may be deposited on at least one of the opposing, vertical sidewalls 119 of the trench 140 by, for example, depositing a thin film comprising catalyst material that is approximately one nanometer thick on at least one of the opposing, vertical sidewalls 119 of the trench 140. The thin film may be deposited by, for example, using physical vapor deposition (PVD) techniques including, but not limited to, thermal evaporation techniques, electron-beam evaporation techniques, filament evaporation techniques, and sputtering techniques. Alternatively, the thin film may be deposited by using chemical vapor deposition (CVD) techniques including, but not limited to, atomic layer deposition techniques.

The structure then may be annealed at an elevated temperature to form self-assembled nanoparticles from the thin film of catalyst material. The structure may be annealed in a closed, controlled environment. A closed, controlled environment may include, but is not limited to, a reactor chamber in which at least the temperature and the pressure may be selectively controlled.

As shown in FIG. 4F, the thin film may be selectively deposited on one of the sidewalls 119 of the trench 140, but not on the opposing sidewall 119, by using an angled deposition process. In an angled deposition process, the substrate 117 may be oriented at an angle with respect to the flow of the catalyst material being deposited. In FIG. 4F, the catalyst material is flowing in the direction indicated by the directional arrow 148. The angle of deposition may be defined as the angle between a vector normal to the surface 118 and the direction of the flow of the catalyst material. The angle of deposition may be selected considering the dimensions of the trench 140 such that the catalyst material is deposited on only one of the sidewalls 119 of the trench 140. The surface 118 of the substrate may shield the opposing sidewall 119 of the trench 140 from deposition of catalyst material. In alternative embodiments, the nanoparticles 146 may be deposited on both of the opposing, vertical sidewalls 119 of the trench 140.

To prevent the deposition of the nanoparticles 146 on surfaces of the substrate 117 other than the opposing, vertical sidewalls 119 of the trench 140, the other surfaces of the substrate 117 may be passivated. By way of example and not limitation, a mask material such as silicon nitride ($Si_3N_4$) may be deposited on all surfaces of the substrate 117. The silicon nitride then may be removed from only the non-vertical surfaces of the substrate 117 by, for example, using a directional reactive-ion etching process. The exposed, non-vertical surfaces of the substrate 117 then may be passivated by, for example, providing an oxide layer on or in the exposed, non-vertical surfaces of the substrate 117. The silicon nitride remaining on the opposing, vertical sidewalls 119 of the trench 140 then may be removed using an etchant that will not remove the oxide layer. In alternative methods, the oxide layer may be selectively provided on or in the non-vertical surfaces of the substrate 117 without masking the opposing, vertical sidewalls 119 of the trench 140.

After the nanoparticles 146 of catalyst material have been deposited on the opposing, vertical sidewalls 119 of the trench 140, the nanowires 120 (FIG. 1) may be formed or grown in the trench 140. For example, the nanowires 120 may be laterally grown in the trench 140 between the opposing, vertical sidewalls 119. A first longitudinal segment 122 of each nanowire 120 (FIG. 1) may be grown in a closed, controlled environment within a chemical vapor deposition (CVD) chamber (not shown) to provide the structure shown in FIG. 4G. The chemical vapor deposition chamber may be heated to an elevated temperature, and a precursor gas or gases may be introduced into the chamber. The precursor gas may include at least one element used to form the first longitudinal segments 122 of the nanowires 120.

In one particular embodiment, the first longitudinal segments 122 may include a silicon-based material. In this embodiment, the nanoparticles 146 of catalyst material may comprise gold-silicon alloy material (formed by depositing a thin film of gold on the silicon material of the opposing, vertical sidewalls 119 of the trench 140 and annealing the thin film, as previously described). The chemical vapor deposition chamber may be heated to a temperature of, for example, about 625° C. and a precursor gas comprising a mixture of $SiH_4$ and HCl may be introduced into the chamber. Other gases that include silicon atoms such as, for example, dichlorosilane ($SiH_2Cl_2$) or silicon tetrachloride ($SiCl_4$) also may be used to grow segments of nanowires 120 that include a silicon-based material.

The growth rate of the first longitudinal segments 122 of the nanowires 120 may be at least partially a function of the temperature and pressure within the chamber and the flow rate of the precursor gas through the chamber. The particular growth rate of the first longitudinal segments 122 of the nanowires 120 for any set of variables may be determined empirically by growing nanowires from the same precursor gas or gases (using the same set of variables) for a selected amount of time and measuring the average length of the nanowires. Once the growth rate is known for a particular set of variables, the first longitudinal segments 122 may be grown to have a selected, predetermined length by growing the first longitudinal segments 122 for a selected, predetermined amount of time.

The growing segments of the nanowires 120 may have a diameter substantially similar to a diameter of the nanoparticles 146 of catalyst material. Therefore, the diameter of the nanowires 120 may be selectively controlled by selectively controlling the size or diameter of the nanoparticles 146.

During formation of the first longitudinal segments 122 of the nanowires 120, the nanoparticles 146 of catalyst material may at least partially decompose the precursor gas or gases into their respective elements. At least some atoms from a precursor gas (such as Si or Ge for example) may diffuse through or around the nanoparticles 146 of catalyst material where they may be precipitated or deposited on the underlying vertical sidewalls 119 of the substrate 117 or on previously grown portions of the first longitudinal segments 122.

The first longitudinal segments 122 of the nanowires 120 may preferentially grow in a direction substantially normal to the vertical sidewall 119 of the trench 140 when the vertical sidewall 119 comprises a (111) plane in the silicon crystal lattice, as previously described.

Figure 4H:
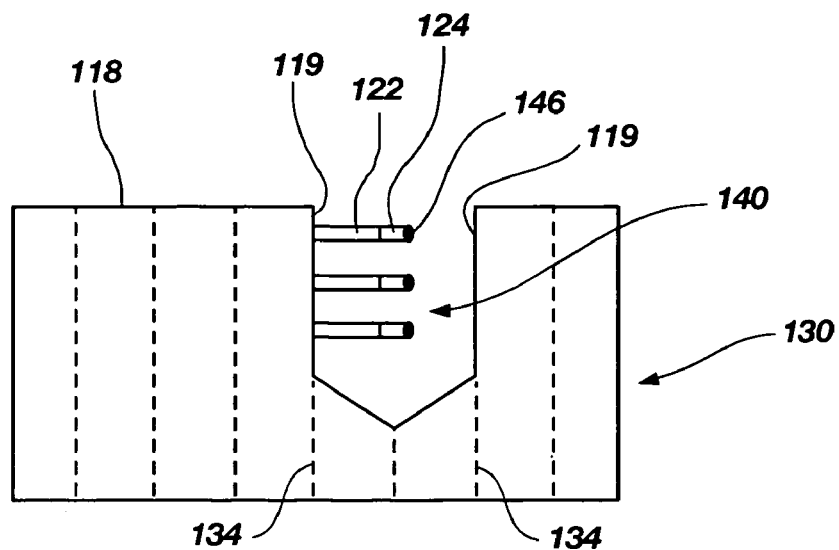

After the first longitudinal segments 122 of the nanowires 120 have been grown to a selected, predetermined length, the second active longitudinal segments 124 of the nanowires 120 may be grown on or from an end of the first longitudinal segments 122 opposite from the vertical sidewall 119 of the trench 140 on which the first longitudinal segments 122 were grown, as shown in FIG. 4H. The second active longitudinal segments 124 may be formed in a manner substantially similar to that previously described in relation to the first longitudinal segments 122 of the nanowires 120. In particular, the composition of the precursor gas or gases flowing through the chamber may be changed to include atoms or elements that will form the second active longitudinal segments 124 of the nanowires 120.

By way of example and not limitation, the second active longitudinal segments 124 may include GaN or ZnO and may be formed by exposing the nanoparticles 146 of catalyst material (which may now be disposed on the ends of the first longitudinal segments 122 of the nanowires 120) to a precursor gas or gases comprising the elements to be used to form the second active longitudinal segments 124 of the nanowires 120 in a closed, controlled environment within a reaction chamber. The reaction chamber may be the same reaction chamber or a different reaction chamber used to form the first longitudinal segments 122 of the nanowires 120.

The second active longitudinal segments 124 also may be grown to have a selected, predetermined length by growing the second active longitudinal segments 124 for a selected, predetermined amount of time at a known growth rate in the same manner previously described in relation to the first longitudinal segments 122.

Figure 4I:
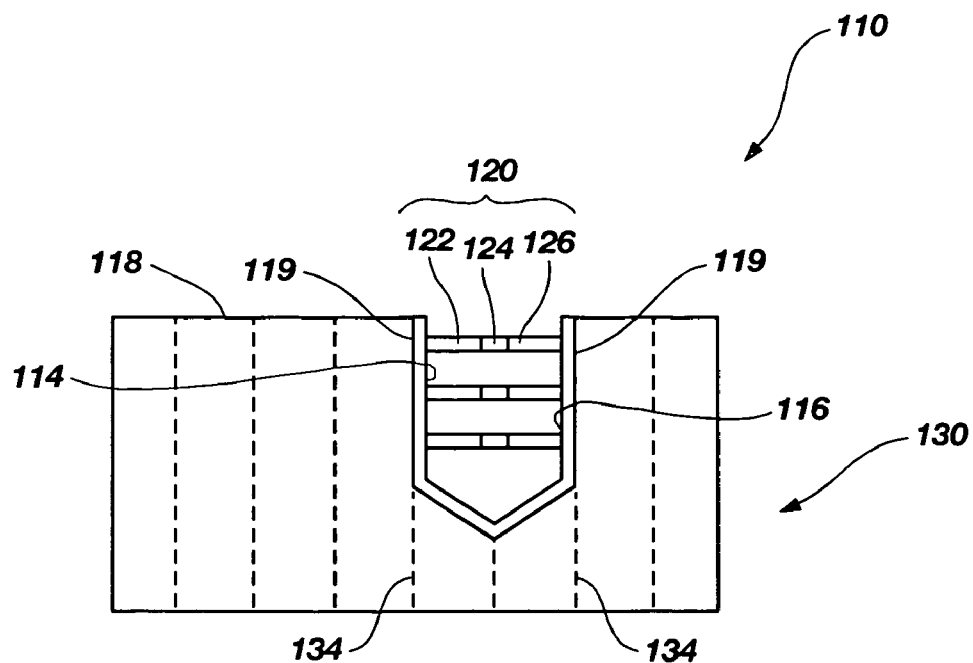

After the second active longitudinal segments 124 of the nanowires 120 have been grown, the third longitudinal segments 126 may be grown on or from an end of the second active longitudinal segments 124 opposite from the first longitudinal segments 122, as shown in FIG. 4I. The third longitudinal segments 126 may be formed in a manner substantially similar to that previously described in relation to the first longitudinal segments 122 of the nanowires 120. In particular, the composition of the precursor gas or gases flowing through the chamber may be changed to include atoms or elements that will form the third longitudinal segments 126 of the nanowires 120.

By way of example and not limitation, the third longitudinal segments 126 of the nanowires 120 may include the same material used to form the first longitudinal segments 122 of the nanowires 120 and may be formed by exposing the nanoparticles 146 of catalyst material (which now may be disposed on the end of the second active longitudinal segments 124 of the nanowires 120) to a precursor gas or gases comprising the elements used to form the third longitudinal segments 126 of the nanowires 120 in a reaction chamber. The reaction chamber may be the same reaction chamber or a different reaction chamber used to form the first longitudinal segments 122 and the second active longitudinal segments 124 of the nanowires 120.

The third longitudinal segments 126 may be grown until they impinge on the opposing vertical sidewall 119. The third longitudinal segments 126 may structurally couple and attach to the opposing vertical sidewall 119 as they grow against and impinge on the sidewall 119, thereby providing structural rigidity to the nanowires 120.

After the nanowires 120 have been grown between the opposing, vertical sidewalls 119, a thin layer of reflective material may be applied to each of the sidewalls 119 to form the first reflective member 114 and the second reflective member 116, as shown in FIG. 4I. Each thin layer of reflective material may be at least partially reflective with respect to the selected, predetermined wavelength of electromagnetic radiation that may be emitted by the active material of the active longitudinal segment 124 of each nanowire 120. In this configuration, the first reflective member 114 and the second reflective member 116 each may include a substantially planar thin layer of reflective material, such as, for example, silver or gold.

The thin layers of reflective material may be deposited on the sidewalls 119 by, for example, using physical vapor deposition techniques including, but not limited to, thermal evaporation techniques, electron-beam evaporation techniques, filament evaporation techniques, and sputtering techniques. Alternatively, the thin layers of reflective material may be deposited on the sidewalls 119 using chemical vapor deposition techniques, including but not limited to, atomic layer deposition techniques.

The methods described in the preceding paragraphs allow for precise positioning of nanoparticles (such as, for example, active quantum dots) comprising a longitudinal segment of a nanowire that has a selected material composition in a resonant cavity. These methods may be used to precisely position such nanoparticles within various other embodiments of resonant cavities, some of which are described below.

Figure 5:
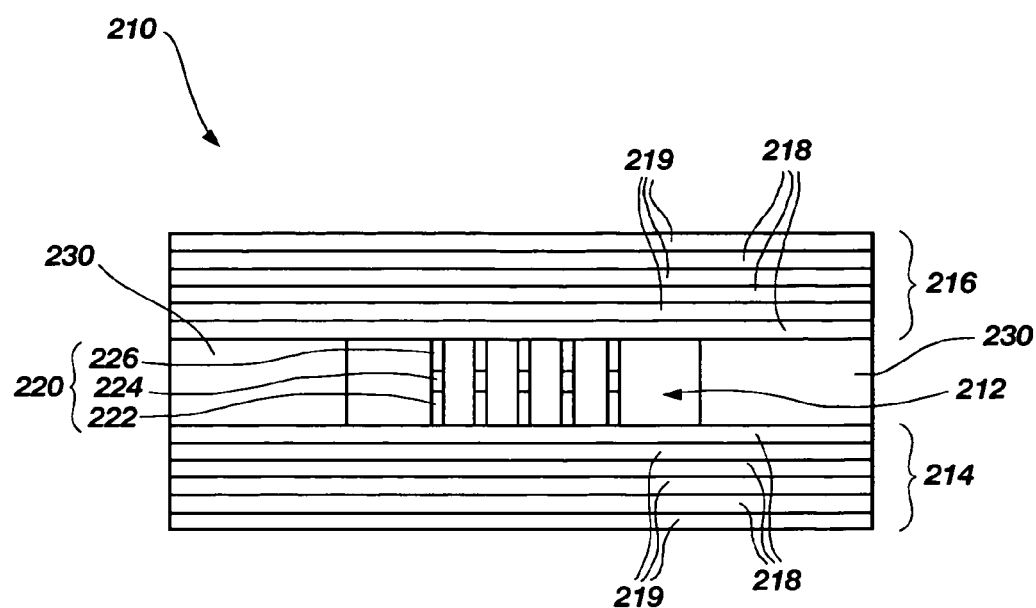
FIG. 5 is a side view of another embodiment of a device of the present invention that includes a nanowire disposed within a resonant cavity.

FIG. 5 is a side view of another device 210 that embodies teachings of the present invention. The device 210 is similar to the device 110 shown in FIG. 1 and includes a resonant cavity 212 and a plurality of nanowires 220 disposed within the resonant cavity 212. Each nanowire 220 may include an active longitudinal segment 224 that comprises an active material. The active longitudinal segment 224 of each nanowire 220 may be substantially composed of active material that is capable of emitting a selected, predetermined wavelength of electromagnetic radiation upon stimulation. The selected, predetermined wavelength may be within a range extending from about three-hundred (300) nanometers to about two-thousand (2,000) nanometers. The resonant cavity 212 may be configured to resonate the selected, predetermined wavelength of electromagnetic radiation that is emitted by the active material of the active longitudinal segment 224 of each nanowire 220.

The active longitudinal segment 224 of each nanowire 220 may be selectively disposed at a predetermined location within the resonant cavity 212. Furthermore, the active longitudinal segment 224 of each nanowire 220 may comprise or behave as an active quantum dot.

With continued reference to FIG. 5, the nanowires 220 may be formed or grown in the vertical direction, in contrast to the nanowires 120 shown in FIG. 1, which were described as being formed or grown in the lateral direction.

The first reflective member 214 and the second reflective member 216 each may include a Bragg mirror (often referred to as a distributed Bragg reflectors or DBR). Bragg mirrors are reflective structures and may have a reflectivity as high as about 99.99%. Bragg mirrors include a multilayer stack of alternating films of high and low refractive index material. As shown in FIG. 5, the first reflective member 214 and the second reflective member 216 each may include alternating layers of low-index films 218 and high-index films 219. The thickness of each low-index film 218 and each high-index film 219 may be selected to be approximately one-fourth the selected, predetermined wavelength of electromagnetic radiation that is emitted by the active material of the active longitudinal segments 224 divided by the refractive index of the material from which the film is formed ($\lambda/4n_{ri}$, where $\lambda$ is the wavelength of the radiation and $n_{ri}$ is the refractive index of the material). In one particular embodiment of the invention, each low-index film 218 may include AlGaAs and each high-index film 219 may include GaAs.

At least one support structure 230 may be provided between at least a portion of the first reflective member 214 and the second reflective member 216 to support the second reflective member 216 relative to the first reflective member 214 and to separate the second reflective member 216 from the first reflective member 214 by a selected distance. The support structure 230 may include a partial layer of material that includes a void formed therethrough in a region comprising the resonant cavity 212.

The first reflective member 214, the at least one support structure 230, and the second reflective member 216 may be formed in a layer-by-layer process by, for example, using physical vapor deposition techniques including, but not limited to, thermal evaporation techniques, electron-beam evaporation techniques, filament evaporation techniques, and sputtering techniques. Alternatively, the first reflective member 214 and the second reflective member 216 may be formed in a layer-by-layer process using chemical vapor deposition techniques including, but not limited to, atomic layer deposition techniques.

The resonant cavity 212 may behave as a Fabry-Perot resonant cavity in a manner substantially similar to that previously described in relation to the resonant cavity 112 shown in FIG. 1. Similarly, each nanowire 220 may be formed or grown between the first reflective member 214 and the second reflective member 216 in a manner substantially similar to that previously described with reference to FIGS. 4F-4I. In particular, nanoparticles of catalyst material may be deposited on a surface of the first reflective member 214 within the resonant cavity 212. A first longitudinal segment 222, second active longitudinal segment 224, and third longitudinal segment 226 of each nanowire 220 then may be grown using the vapor-liquid-solid reaction or mechanism, as previously described herein. The first longitudinal segment 222 of each nanowire may be structurally coupled to the first reflective member 214, and the third longitudinal segment 226 may be structurally coupled to the second reflective member 216. Furthermore, the second active longitudinal segment 224 of each nanowire 220 may be selectively disposed at a predetermined location within the resonant cavity 212 by growing the first longitudinal segment 222 of each nanowire 220 at a known growth rate for a selected, predetermined amount of time as previously described. Moreover, each segment 222, 224, 226 of each nanowire 220 may have a selected, predetermined length, which may be provided by growing each segment 222, 224, 226 of each nanowire 220 at a known growth rate for a selected, predetermined amount of time as previously described.

The device 110 shown in FIG. 1 and the device 210 shown in FIG. 5 each include a Fabry-Perot resonant cavity provided by two substantially planar and parallel reflective members. Other devices that embody teachings of the present invention may include resonant cavities having other configurations.

Figure 6A:
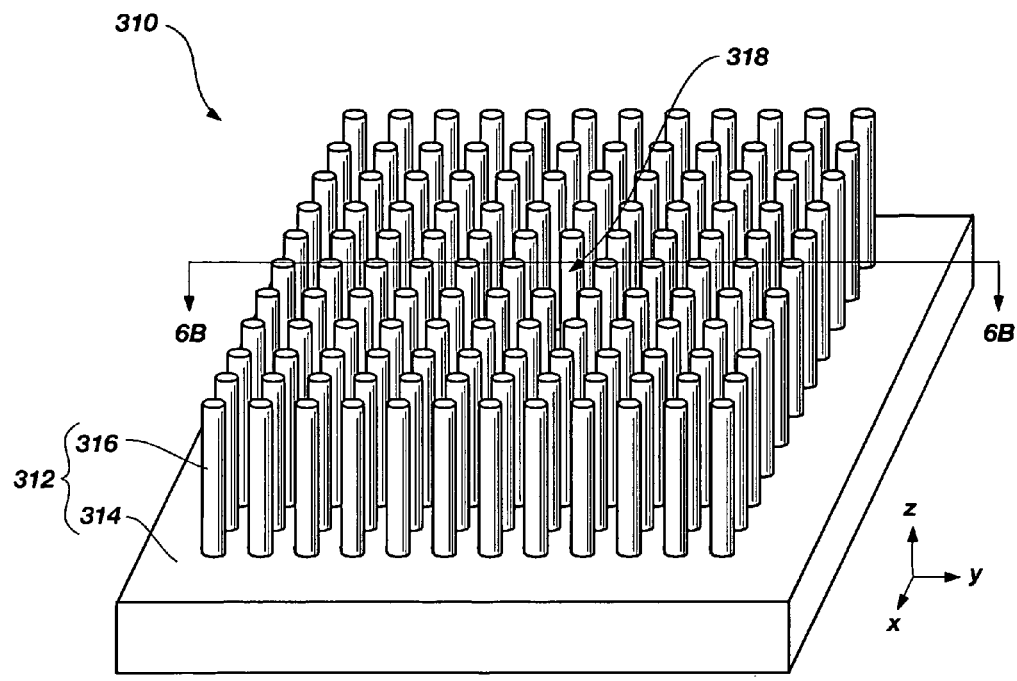
FIG. 6A is a perspective view of another exemplary device of the present invention that includes a nanowire disposed within a resonant cavity.
Figure 6B:
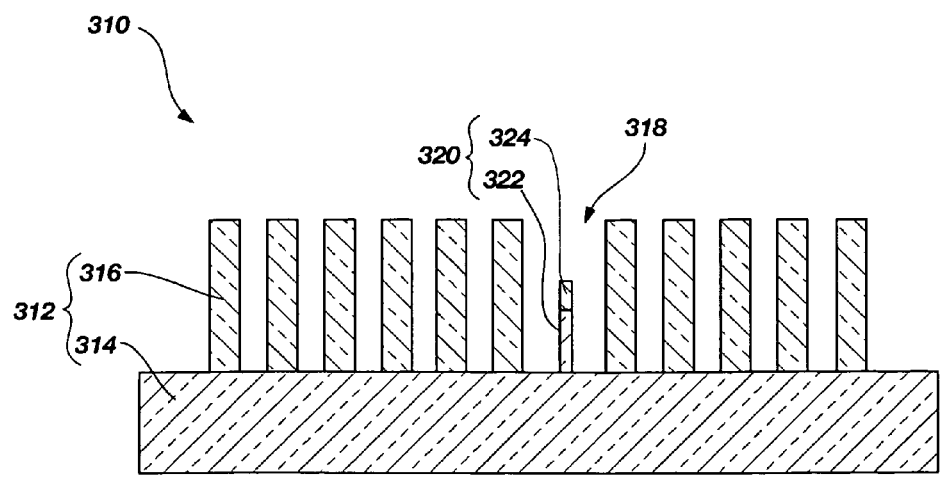
FIG. 6B is a cross-sectional view of the device shown in FIG. 6A taken along section line 6B-6B shown therein.

Another device 310 that embodies teachings of the present invention is shown in FIGS. 6A-6B. The device 310 includes a two-dimensional (2D) photonic crystal 312 that includes a resonant cavity 318 and at least one nanowire 320 disposed within the resonant cavity 318. The at least one nanowire 320 may include an active longitudinal segment 324 that comprises an active material. The active longitudinal segment 324 of the nanowire 320 may be substantially composed of active material that is capable of emitting electromagnetic radiation at a selected, predetermined wavelength upon stimulation. The selected, predetermined wavelength may be within a range extending from about three-hundred (300) nanometers to about two-thousand (2,000) nanometers. The resonant cavity 318 may be configured to resonate the selected, predetermined wavelength of electromagnetic radiation that is emitted by the active material of the active longitudinal segment 324 of the at least one nanowire 320.

Photonic crystals are a class of man-made materials that may be formed by dispersing a material of one dielectric constant (or refractive index) periodically within a matrix having a different dielectric constant (or refractive index). A one-dimensional photonic crystal is a three-dimensional structure that exhibits periodicity in dielectric constant in only one dimension. Bragg mirrors, such as those shown in FIG. 5 and previously described herein, are one example of a one-dimensional photonic crystal. The alternating thin layers have different dielectric constants (and thus, different refractive indices). The combination of several thin layers forms a three-dimensional structure that exhibits periodicity in dielectric constant in only the direction orthogonal to the planes of the thin layers. No periodicity is exhibited in either of the two dimensions contained within the plane of the layers.

A two-dimensional photonic crystal can be formed by periodically dispersing rods or columns of a material of one dielectric constant within a matrix having a different dielectric constant. Two-dimensional photonic crystals exhibit periodicity in the directions perpendicular to the length of the rods or columns, but no periodicity is exhibited in the direction parallel to the length of the columns.

Finally, a three-dimensional photonic crystal can be formed by periodically dispersing small spheres or other spatially confined areas of a first material having a first dielectric constant within a matrix of a second material having a second, different, dielectric constant. Three-dimensional photonic crystals exhibit periodicity in dielectric constant in all three dimensions within the crystal.

Photonic crystals may exhibit a photonic bandgap over a range of wavelengths in directions exhibiting periodicity in dielectric constant. In other words, there may be a range of wavelengths of electromagnetic radiation that will not be transmitted through the photonic crystal in the directions exhibiting periodicity in dielectric constant. This range of wavelengths that are not transmitted is known as a photonic bandgap of the photonic crystal. No photonic bandgap is exhibited in directions that do not exhibit periodicity in dielectric constant.

When defects are introduced into the periodic dielectric structure of a photonic crystal, localized electromagnetic modes may be allowed at wavelengths within the photonic bandgap. For example, resonant cavities have been formed in photonic crystals by introducing point defects into the periodic dielectric structure, and waveguides have been formed in photonic crystals by introducing line defects into the periodic dielectric structure.

The photonic crystal 312 shown in FIGS. 6A-6B includes a plurality of elongated cylindrical rods 316 extending from a surface of a substrate 314. The rods 316 may have a uniform radius and may be disposed in what is referred to in the art as a square lattice. The square lattice may have a lattice constant defined as the distance separating the center of one rod 316 from the center of adjacent rods 316. The rods 316 exhibit a dielectric constant that differs from a dielectric constant exhibited by the space between the rods 316.

The resonant cavity 318 may be provided in the photonic crystal 312 by providing a point defect in the periodic lattice. Such a defect may be provided by, for example, removing or failing to form at least one rod 316. As can be seen in FIG. 6B, one rod 316 is missing in a row of rods 316 to define the resonant cavity 318.

The nanowire 320 may extend from a surface of the substrate 314 at or near the location of the missing rod 316. The active longitudinal segment 324 of each nanowire 320 may be selectively disposed at a predetermined location within the resonant cavity 318. Furthermore, the active longitudinal segment 324 of each nanowire 320 may comprise or behave as an active quantum dot.

The at least one nanowire 320 may be formed or grown on a surface of the substrate 314 within the resonant cavity 318 in a manner substantially similar to that previously described in relation to the nanowires 120 and FIGS. 4F-4I. In particular, at least one nanoparticle of catalyst material may be deposited on a surface of the substrate 314 within the resonant cavity 318. A first longitudinal segment 322 and a second active longitudinal segment 324 of the nanowire 320 then may be grown using the vapor-liquid-solid reaction or mechanism, as previously described. The first longitudinal segment 322 of the nanowire may be structurally coupled to the substrate 314. Furthermore, the second active longitudinal segment 324 of the nanowire 320 may be selectively disposed at a predetermined location within the resonant cavity 318 by growing the first longitudinal segment 322 of the nanowire 320 at a known growth rate for a selected, predetermined amount of time, as previously described. Moreover, each segment 322, 324 of the at least one nanowire 320 may have a selected, predetermined length, which may be provided by growing each segment 322, 324 of the nanowire 320 at a known growth rate for a selected, predetermined amount of time.

The photonic crystal 312 may exhibit a photonic bandgap over a range of wavelengths of electromagnetic radiation. Certain electromagnetic defect modes at wavelengths within the photonic bandgap may be allowed within the resonant cavity 318. At least one of the electromagnetic defect modes may resonate within the resonant cavity 318. Determining the photonic band structure (which may be used to determine the allowed and prohibited electromagnetic modes) of a particular photonic crystal is a complex problem that involves solving the Maxwell equations considering the periodic variation in the dielectric constant through the photonic crystal. Thus, the photonic band structure is at least partially a function of the dielectric constant of the rods 316, the dielectric constant of the spaces between the rods 316, the uniform radius of the rods 316, and the lattice constant of the photonic crystal. Computational methods for computing the band structure of a particular photonic crystal are known in the art. An explanation of these computational methods may be found in, for example, John D. Joannopoulas, Robert D. Meade & Joshua N. Winn, Photonic Crystals—Molding the Flow of Light, (Princeton University Press 1995), in particular at Appendix D.

By way of example and not limitation, the material from which the rods 316 are formed, the uniform radius of the rods 316, and the lattice constant of the photonic crystal 312 may be selected such that the photonic crystal 312 exhibits a photonic bandgap over a range of wavelengths that includes the wavelength of the electromagnetic radiation that may be emitted by the second active longitudinal section 324 of the nanowire 320 upon stimulation. Furthermore, the resonant cavity 318 may exhibit a defect mode at the selected, predetermined wavelength of the electromagnetic radiation that may be emitted by the second active longitudinal section 324. In this configuration, electromagnetic radiation emitted by the second active longitudinal section 324 of the nanowire 320 may resonate within the resonant cavity 318.

In alternative embodiments, the resonant cavity 318 may provided by one rod 316 having a radius that is smaller than the uniform radius of the other rods 316, and the at least one nanowire 320 may be disposed proximate or on the rod 316 having the smaller radius.

Devices that embody teachings of the present invention may include photonic crystals having configurations other than that shown in FIGS. 6B-6C.

Figure 7A:
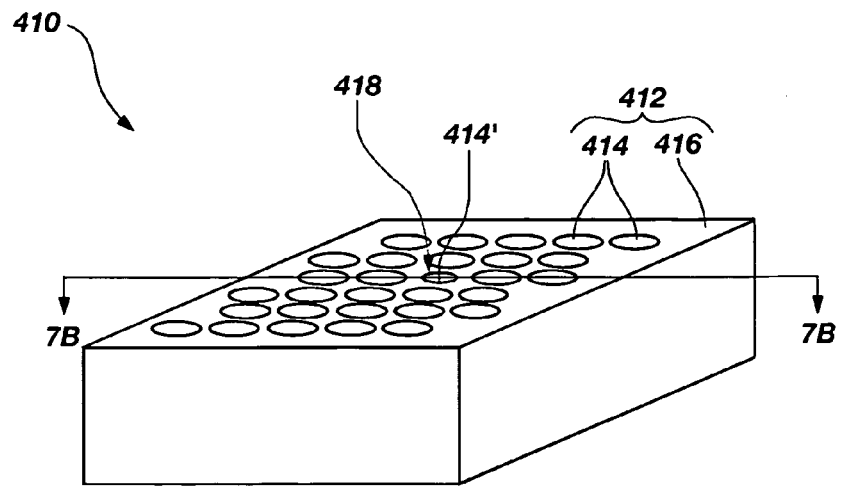
FIG. 7A is a perspective view of another embodiment of a device of the present invention that includes a nanowire disposed within a resonant cavity.
Figure 7B:
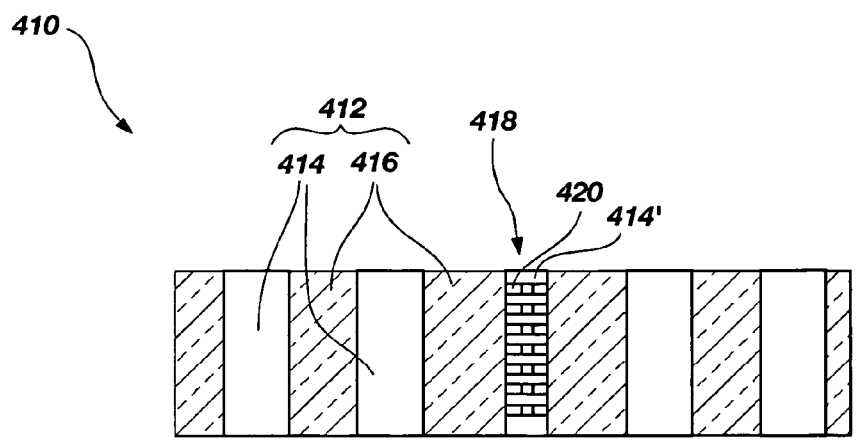
FIG. 7B is a cross-sectional view of the device shown in FIG. 7A taken along section line 7B-7B shown therein.
Figure 7C:
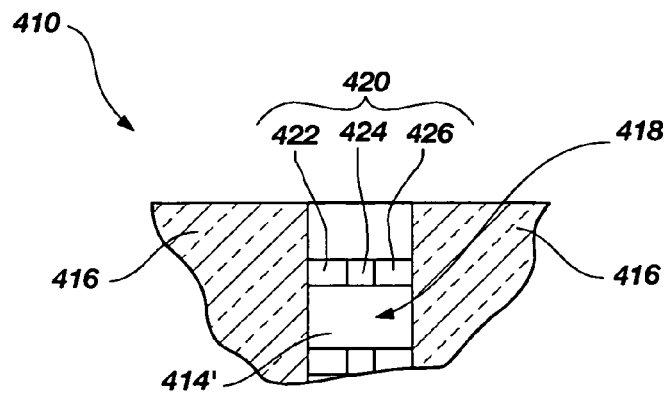
FIG. 7C is an enlarged partial view of the device shown in FIGS. 7A-7B.

Another device 410 that embodies teachings of the present invention is shown in FIGS. 7A-7C. The device 410 includes a two-dimensional (2D) photonic crystal 412 that includes a resonant cavity 418 and a plurality of nanowires 420 (FIG. 7B) disposed within the resonant cavity 418. Each nanowire 420 may include an active longitudinal segment 424 that comprises an active material. The active longitudinal segment 424 of each nanowire 420 may be substantially composed of active material that is capable of emitting electromagnetic radiation at a selected, predetermined wavelength upon stimulation. The selected, predetermined wavelength may be within a range extending from about three-hundred (300) nanometers to about two-thousand (2,000) nanometers. The resonant cavity 418 may be configured to resonate the selected, predetermined wavelength of electromagnetic radiation that is emitted by the active material of the active longitudinal segment 424 of each nanowire 420.

Referring to FIG. 7A, the photonic crystal 412 may include a plurality of cylindrical regions 414 dispersed periodically in an array of rows throughout a matrix 416. A majority of the cylindrical regions 414 have a uniform radius. The matrix 416 exhibits a dielectric constant that differs from a dielectric constant exhibited by the cylindrical regions 414. In one particular embodiment, the matrix 416 may have a dielectric constant of about 11.4 and the cylindrical regions 414 may have a dielectric constant of about 1. For example, the matrix 416 may be formed from a semiconductor material such as GaAs and the cylindrical regions 414 may include air. Such a structure may be formed by etching the cylindrical regions 414 in a layer of GaAs using known lithographic techniques such as, for example, masking and etching. Dielectric periodicity is exhibited in the photonic crystal in directions perpendicular to a longitudinal axis (not shown) of the cylindrical regions 414.

The cylindrical regions 414 of the photonic crystal 412 may be configured in what is referred to in the art as a triangular lattice. The triangular lattice has a lattice constant defined as the distance separating the center of one cylindrical region 414 from the center of adjacent cylindrical regions 414. The ratio of the uniform radius of the majority of cylindrical regions 414 to the lattice constant of the photonic crystal 412 may be in a range from about 0.2 to about 0.5.

The photonic crystal 412 may include a resonant cavity 418. The resonant cavity 418 may be provided by including a point defect in the lattice of cylindrical regions 414. For example, a point defect may be provided by including a cylindrical region 414' having a radius that is less than the uniform radius of the other cylindrical regions 414 in the lattice of the photonic crystal 412.

Referring to FIG. 7B, each nanowire 420 of the plurality of nanowires 420 may extend laterally from a surface of the matrix 416 at a location within the cylindrical region 414', which has a radius smaller than the uniform radius of the other cylindrical regions 414 and provides the resonant cavity 418.

Referring to FIG. 7C, each nanowire 420 of the plurality of nanowires 420 may be formed or grown on a surface of the matrix 416 within the resonant cavity 418 (i.e., within the cylindrical region 414') in a manner substantially similar to that previously described in relation to the nanowires 120 and FIGS. 4F-4I. In particular, a plurality of nanoparticles of catalyst material may be deposited on a surface of the matrix 416 within the cylindrical region 414'. A first longitudinal segment 422, a second active longitudinal segment 424, and a third longitudinal segment 426 of each nanowire 420 then may be grown using the vapor-liquid-solid reaction or mechanism, as previously described. The first longitudinal segment 422 and the third longitudinal segment 426 of each nanowire 420 may be structurally coupled to the surface of the matrix 416 within the cylindrical region 414'. Furthermore, the second active longitudinal segment 424 of each nanowire 420 may be selectively disposed at a predetermined location within the resonant cavity 418 by growing the first longitudinal segment 422 of each nanowire 420 at a known growth rate for a selected, predetermined amount of time, as previously described. Moreover, each segment 422, 424, 426 of each nanowire 420 may have a selected, predetermined length, which may be provided by growing each segment 422, 424, 426 of each nanowire 420 at a known growth rate for a selected, predetermined amount of time. The second active longitudinal segment 424 of each nanowire 420 may comprise or behave as an active quantum dot.

The photonic crystal 412 may exhibit a photonic bandgap over a range of wavelengths of electromagnetic radiation. Certain electromagnetic defect modes at wavelengths within the photonic bandgap may be allowed within the resonant cavity 418. At least one of the electromagnetic defect modes may resonate within the resonant cavity 418. As previously discussed, the photonic band structure is at least partially a function of the dielectric constant of the matrix 416, the dielectric constant of the cylindrical regions 414, the uniform radius of the cylindrical regions 414 and the lattice constant of the photonic crystal 412. Computational methods for computing the band structure of a particular photonic crystal are known in the art.

By way of example and not limitation, the material from which the matrix 416 is formed, the uniform radius of the cylindrical regions 414, and the lattice constant of the photonic crystal 412 may be selected such that the photonic crystal 412 exhibits a photonic bandgap over a range of wavelengths that includes the selected, predetermined wavelength of electromagnetic radiation that may be emitted by the second active longitudinal section 424 of each nanowire 420 upon stimulation. Furthermore, the resonant cavity 418 may exhibit a defect mode at the wavelength of the selected, predetermined wavelength of electromagnetic radiation that may be emitted by each second active longitudinal section 424. In this configuration, electromagnetic radiation emitted by the second active longitudinal section 424 of each nanowire 420 may resonate within the resonant cavity 418.

In alternative embodiments, the photonic crystal 412 may be disposed on a substrate (not shown) and each nanowire 420 of the plurality of nanowires 420 may extend vertically from a surface of the substrate within the cylindrical region 414'.

Each of the device 310 shown in FIGS. 6A-6B and the device 410 shown in FIGS. 7A-7C may additionally include a waveguide coupled to the resonant cavities provided therein and configured to direct electromagnetic radiation to or from the resonant cavities. By way of example and not limitation, waveguides may be provided in each of the device 310 shown in FIGS. 6A-6B and the device 410 shown in FIGS. 7A-7C by forming linear defects (missing rows of rods or cylindrical regions) in the lattice structure of the photonic crystal.

Each of the previously described devices that embody teachings of the present invention includes a resonant cavity and a nanowire disposed within the resonant cavity. The nanowire includes an active longitudinal segment that is selectively disposed at a predetermined location within the resonant cavity. Each of the active longitudinal segments may include an active material that is capable of emitting electromagnetic radiation upon stimulation by, for example, irradiating the active material with electromagnetic radiation having a particular wavelength (often referred to as "optical pumping"). In alternative embodiments of the present invention, nanowires may include active longitudinal sections that include an active material that is capable of emitting electromagnetic radiation upon electrical stimulation. For example, the nanowires may include a semiconductor diode and the active longitudinal segment may comprise an active layer, which may be selectively disposed at a predetermined location within a resonant cavity.

Figure 8A:
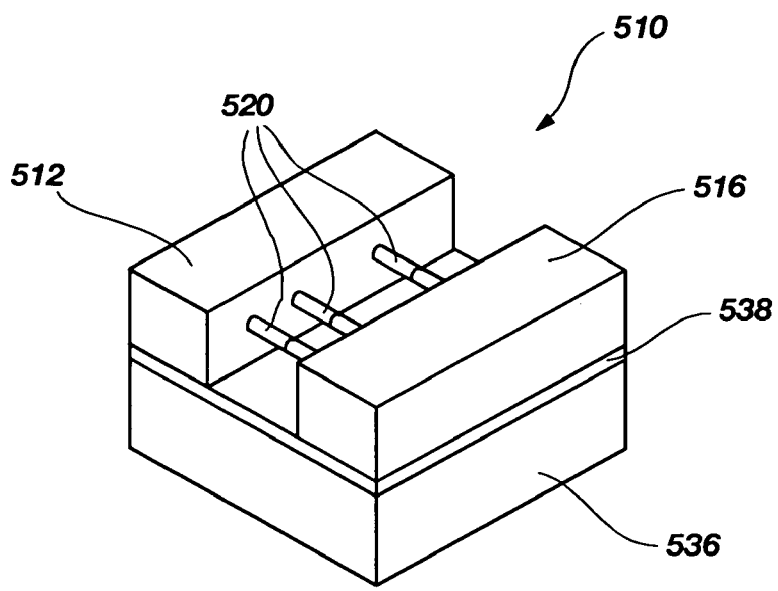
FIG. 8A is a perspective view of another embodiment of a device of the present invention.
Figure 8B:
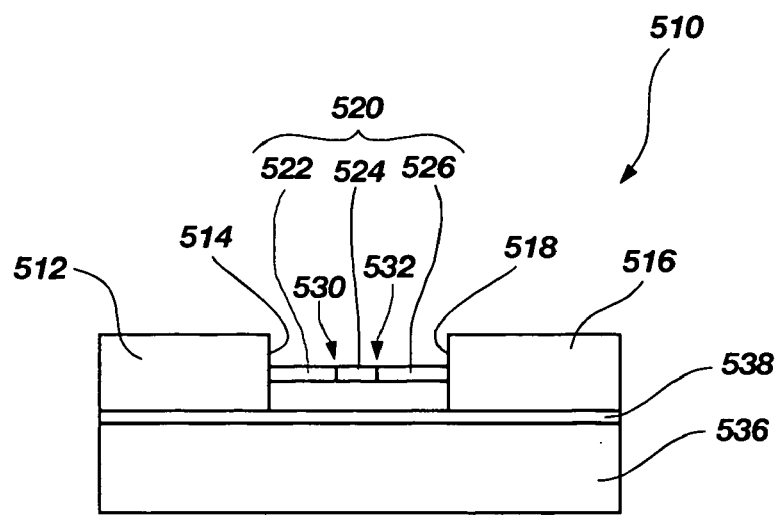
FIG. 8B is a side view of the device shown in FIG. 8A.

A radiation-emitting device 510 that embodies teachings of the present invention is shown in FIGS. 8A-8B. The radiation-emitting device 510 includes a first electrode 512, a second electrode 516, and at least one nanowire 520 extending between the first electrode 512 and the second electrode 516. The radiation-emitting device 510 may include a plurality of nanowires 520. A first end of each nanowire 520 may be structurally and electrically coupled to the first electrode 512, and a second, opposite end of the at least one nanowire 520 may be structurally and electrically coupled to the second electrode 516. The at least one nanowire 520 may include a double-heterostructure semiconductor device that is configured to emit electromagnetic radiation when a voltage is applied across the nanowire 520 between the first electrode 512 and the second electrode 516.

The radiation-emitting device 510 may further include a substrate 536. The substrate 536 may include a semiconductor material, which may be similar to the semiconductor material of the first electrode 512 and the second electrode 516. Furthermore, a layer of electrical insulator material 538 may be provided between the substrate 536 and the electrodes 512, 516. In alternative embodiments, the substrate 536 may include an electrical insulator material, and no additional layer of electrical insulator material 538 is necessary. Furthermore, the substrate 536 may comprise a portion or region of a higher level device.

The first electrode 512 and the second electrode 516 each may include a portion or region of a layer of semiconductor material. The portion or region of the layer of semiconductor material may be doped to provide an n-type semiconductor material or a p-type semiconductor material. The layer of electrical insulator material 538 may electrically insulate the first electrode 512 from the second electrode 516, and may electrically insulate the substrate 536 from the electrodes 512, 516.

By way of example and not limitation, the radiation-emitting device 510 may include three nanowires 520 extending between the first electrode 512 and the second electrode 516. As shown in FIG. 8B, each nanowire 520 may include a first longitudinal segment 522, a second active longitudinal segment 524, and a third longitudinal segment 526. An end of each first longitudinal segment 522 may be structurally and electrically coupled to the first electrode 512, and an end of each third longitudinal segment 526 may be structurally and electrically coupled to the second electrode 516. A first end of each second active longitudinal segment 524 may be structurally and electrically coupled to an end of a first longitudinal segment 522 opposite the first electrode 512, and a second end of each second active longitudinal segment 524 may be structurally and electrically coupled to an end of a third longitudinal segment 526 opposite the second electrode 516. The second active longitudinal segments 524 may have a length that is relatively short compared to a length of the first longitudinal segments 522 and the third longitudinal segments 526.

The first longitudinal segments 522 may comprise an n-type semiconductor material, the second active longitudinal segments 524 may comprise a first p-type material, and the third longitudinal segments 526 may comprise a second p-type material. The first p-type material of the second active longitudinal segments 524 may differ from both the n-type semiconductor material of the first longitudinal segments 522 and the second p-type material of the third longitudinal segments 526. The bandgap energy in the second active longitudinal segments 524 may be different from the bandgap energy in the first longitudinal segments 522 and the third longitudinal segments 526.

In this configuration, each interface or junction 530 between a first longitudinal segment 522 and a second active longitudinal segment 524 may comprise a heterojunction, and each interface or junction 532 between a second active longitudinal segment 524 and a third longitudinal segment 526 also may comprise a heterojunction, thereby providing a double-heterostructure device. Furthermore, the bandgap energy in the first longitudinal segments 522 may be the same as, or different from, the bandgap energy in the third longitudinal segments 526.

The bandgap energy in the second active longitudinal segments 524 may be less than the bandgap energy in the first longitudinal segments 522 and the third longitudinal segments 526.

The first electrode 512 may include an n-type semiconductor material, which may be identical to the n-type semiconductor material of the first longitudinal segments 522. The second electrode 516 may include a p-type semiconductor material, which may be identical to the second p-type semiconductor material of the third longitudinal segments 526.

By way of example and not limitation, the n-type semiconductor material of the first longitudinal segments 522, the first p-type semiconductor material of the second active longitudinal segments 524, and the second p-type semiconductor material of the third longitudinal segments 526 each may include a silicon-based material or a germanium-based material.

In alternative embodiments of the invention, the n-type semiconductor material of the first longitudinal segments 522, the first p-type semiconductor material of the second active longitudinal segments 524, and the second p-type semiconductor material of the third longitudinal segments 526 each may include a III-V type semiconductor material or a II-VI type semiconductor material. Furthermore, each nanowire 520 may be doped with or otherwise include erbium ions or boron ions.

Figure 9A:
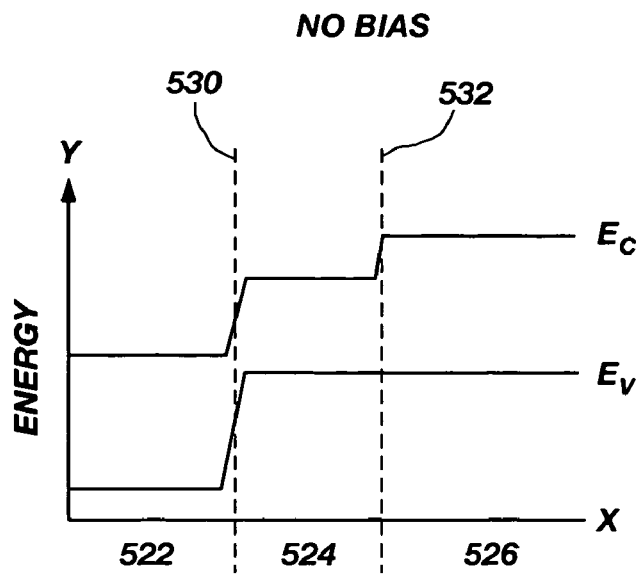
FIGS. 9A-9C are simplified energy band diagrams of a nanowire shown in FIGS. 8A-8B.

FIG. 9A illustrates a simplified exemplary energy band diagram of a nanowire 520 in the absence of a bias across the nanowire 520 (i.e., there is no voltage applied between the first electrode 512 and the second electrode 516). The energy band diagram illustrates an example of the general relationship which may be provided between the energy levels of the conduction bands $E_c$ and the energy levels of the valence bands $E_v$ in each of the first longitudinal segments 522, the second active longitudinal segments 524, and the third longitudinal segments 526. In the diagram, increasing energy is represented in the positive (vertically upwards) direction along the Y axis and the relative position along the nanowire 520 is represented along the X axis. The bandgap energy in each segment is the difference between the energy level of the conduction band $E_c$ and the energy level of the valence band $E_v$ in that segment (i.e., bandgap energy=$E_c$-$E_v$).

Figure 9B:
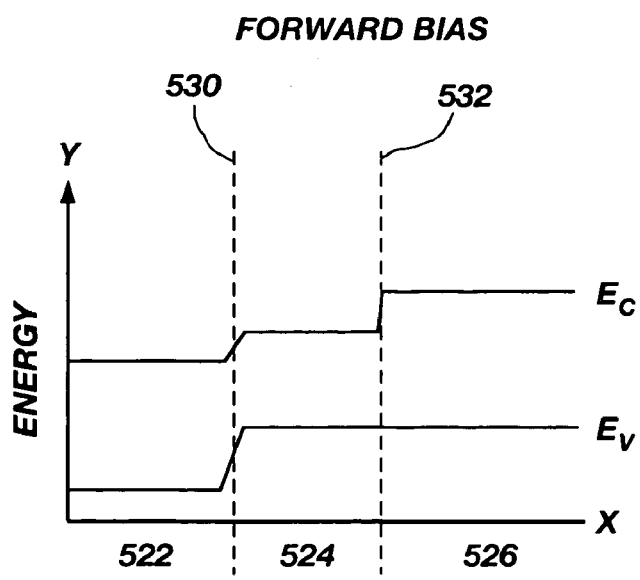

FIG. 9B is substantially similar to FIG. 9A, but illustrates an example of the general relationship which may be provided between the energy levels of the conduction bands $E_c$ and the energy levels of the valence bands $E_v$ in each of the first longitudinal segments 522, the second active longitudinal segments 524, and the third longitudinal segments 526 in the presence of an applied forward bias (i.e., when a voltage difference is applied between the first electrode 512 and the second electrode 516).

As can be seen by comparing the energy band diagram shown in FIG. 9A with the energy band diagram shown in FIG. 9B, the difference between the energy level of the conduction band $E_c$ in the first longitudinal segment 522 and the energy level of the conduction band $E_c$ in the second active longitudinal segment 524 may be reduced in the presence of a forward bias. This difference between the energy level of the conduction band $E_c$ in the first longitudinal segment 522 and the energy level of the conduction band $E_c$ in the second active longitudinal segment 524 may provide an energy barrier that must be overcome by electrons passing from the first longitudinal segment 522 into the second active longitudinal segment 524. When no voltage is applied between the first electrode 512 and the second electrode 516, this energy barrier may be too high for the electrons in the conduction band of the first longitudinal segment 522 to overcome, and the electrons may be prevented from being injected into the second active longitudinal segment 524 of the nanowire 520 across the junction 530. In the presence of a forward bias, however, the energy barrier may be significantly reduced, and electrons may be injected into the second active longitudinal segment 524 of the nanowire 520 across the junction 530. These electrons may recombine with holes in the second active longitudinal segment 524 of the nanowire 520. Photons of electromagnetic radiation may be emitted by the nanowire 520 upon recombination of the electrons with the holes in the second active longitudinal segment 524 of the nanowire 520.

As can be seen with reference to FIG. 9B, the difference between the energy level of the conduction band $E_c$ in the third longitudinal segment 526 and the energy level of the conduction band $E_c$ in the second active longitudinal segment 524 may be large enough (even in the presence of a forward bias) to prevent electrons in the conduction band of the second active longitudinal segment 524 from being injected into the third longitudinal segment 526 of the nanowire 520 across the junction 532. In other words, electrons in the conduction band may be confined to the conduction band of the second active longitudinal segment 524 due to the energy barrier between the conduction band of the second active longitudinal segment 524 and the conduction band of the third longitudinal segment 526. By confining the electrons in the conduction band to the relatively short second active longitudinal segment 524 of the nanowire 520, a relatively high concentration of charge carriers (electrons and holes) may be provided, which may enhance recombination and emission of electromagnetic radiation.

Figure 9C:
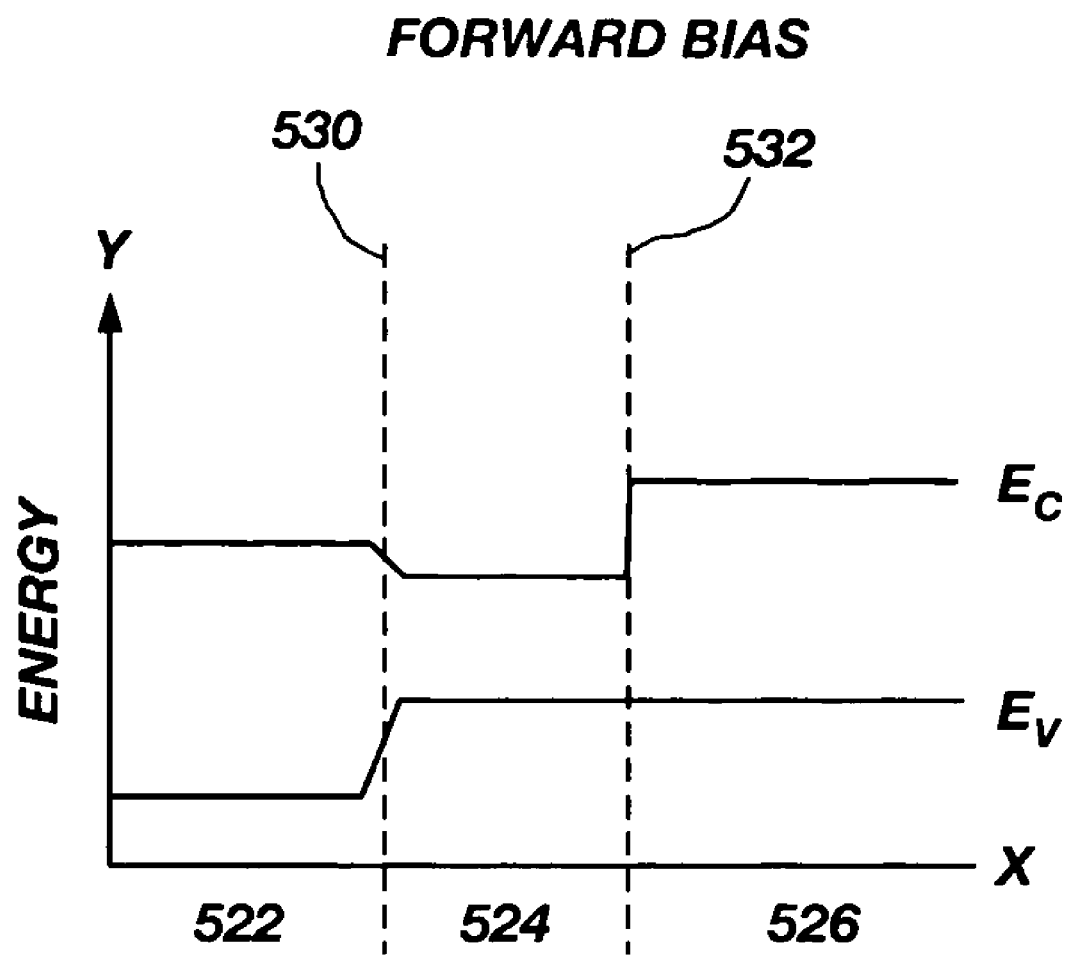

In alternative embodiments of the invention, the general relationship between the energy band structures of the longitudinal segments 522, 524, 526 of each nanowire 520 may be as depicted in FIG. 9C. The general relationship between the energy band structures of the longitudinal segments 522, 524, 526 as depicted in FIG. 9C is substantially similar to the general relationship between the energy band structures of the longitudinal segments 522, 524, 526 as depicted in FIG. 9B. As seen in FIG. 9C, however, the energy level of the conduction band $E_c$ in the second active longitudinal segments 524 may be lower than the energy level of the conduction band $E_c$ in the first active longitudinal segments 522 when a forward bias is applied across the nanowires 520. In such a configuration, electrons in the conduction band may be further confined to the conduction band of the second active longitudinal segments 524 due to the energy barrier between the conduction band of the second active longitudinal segments 524 and the conduction band of the first longitudinal segments 522. By further confining the electrons in the conduction band to the relatively short second active longitudinal segments 524 of the nanowires 520, a concentration of charge carriers (electrons and holes) may be further increased, which may further enhance recombination and emission of electromagnetic radiation.

As is known in the art, the energy difference between the energy of the electrons before recombination (the energy of the electron in the conduction band) and the energy of the electrons after recombination (the energy of the electron in the valence band) may define the wavelengths of electromagnetic radiation that are emitted by the nanowire 520. In some embodiments of the invention, the second p-type material of the second active longitudinal segment 524 of the nanowire 520 may be selected to exhibit a bandgap energy in a range extending from about 1.5 electron volts (eV) to about 3.0 electron volts (eV). In this configuration, the nanowire 520 may be configured to emit electromagnetic radiation having a wavelength in a range extending from about 400 nanometers to about 800 nanometers when a voltage is applied across the nanowire 520 between the first electrode 512 and the second electrode 516.

Optionally, the exterior surfaces of the nanowires 520 and, in particular, the second active longitudinal segments 524 of the nanowires 520 may be passivated to minimize surface recombination between electrons and holes. By way of example and not limitation, if the second active longitudinal segments 524 of the nanowires 520 comprises a germanium-based material, the surfaces of the second active longitudinal segments 524 of the nanowires 520 may be passivated by depositing or growing a thin layer of a silicon-based material on the surfaces of the second active longitudinal segments 524 of the nanowires 520.

The radiation device 510 may further include a resonant cavity. By way of example and not limitation, the first electrode 512 may include a substantially vertical sidewall 514 and the second electrode 516 may include an opposing, substantially vertical sidewall 518, as shown in FIG. 8B. The substantially vertical sidewall 514 and the substantially vertical sidewall 518 may be substantially parallel to one another, and the materials of the first electrode 512 and the second electrode 516 may be at least partly reflective with respect to the electromagnetic radiation emitted by the nanowires 520. In this configuration, the first electrode 512 and the second electrode 516 may define a Fabry-Perot resonant cavity that behaves in a manner similar to that previously described in relation to the Fabry-Perot resonant cavity 112 of the device 110 shown in FIG. 1.

Furthermore, the distance separating the first electrode 512 and the second electrode 516 may be selected to be equal to an integer multiple of one-half of a wavelength of electromagnetic radiation that is emitted by the nanowires 520, which are disposed within the resonant cavity. In this configuration, the resonant cavity may be configured to resonate at least one wavelength of electromagnetic radiation that is emitted by the nanowires 520. Optionally, a thin layer of reflective material may be applied to at least one of the substantially vertical sidewall 514 and the substantially vertical sidewall 518.

As will be obvious to those of ordinary skill in the art, the light-emitting device 510 shown in FIGS. 8A-8B may be fabricated using the methods previously described herein in relation to the device 110 and FIGS. 4A-4I.

The devices and methods described herein provide improved devices that may be used in a wide variety of devices and applications. By way of example and not limitation, such devices and methods may be used in light-emitting diodes, optical amplifiers, lasers, optical signal processing devices, and molecular sensors.

Although the foregoing description contains many specifics, these are not to be construed as limiting the scope of the present invention, but merely as providing certain representative embodiments. Similarly, other embodiments of the invention can be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. A radiation-emitting device comprising:
    a first electrode:
    a second electrode;
        at least one nanowire extending between the first electrode and the second electrode, the nanowire being structurally and electrically coupled to the first electrode and the second electrode, the nanowire comprising a double-heterostructure semiconductor device configured to emit electromagnetic radiation when a voltage is applied across the nanowire between the first electrode and the second electrode a first longitudinal segment comprising an n-type semiconductor material;
    a second active longitudinal segment comprising a first p-type semiconductor material, the second active longitudinal segment being structurally and electrically coupled to an end of the first longitudinal segment; and
    a third longitudinal segment comprising a second p-type semiconductor material, the third longitudinal segment being structurally and electrically coupled to an end of the second active longitudinal segment opposite the first longitudinal segment; and
    wherein the first p-type semiconductor material differs from both the n-type semiconductor material and the second p-type semiconductor material.

2. The radiation-emitting device of claim 1, wherein the first p-type semiconductor material exhibits a bandgap differing from both bandgap exhibited by the n-type semiconductor material and a bandgap exhibited by the second p-type semiconductor material.

3. The radiation-emitting device of claim 2, wherein the bandgap exhibited by the n-type semiconductor material is equal to the bandgap exhibited by the second p-type semiconductor material.

4. The radiation-emitting device of claim 1, wherein the n-type semiconductor material comprises a silicon-based material or a germanium-based material, the first p-type semiconductor material comprises a silicon-based material or a germanium-based material, and the second p-type semiconductor material comprises a silicon-based material or a germanium-based material.

5. The radiation-emitting device of claim 1, wherein the first electrode comprises an n-type semiconductor material, the first longitudinal segment of the nanowire being structurally and electrically coupled to the first electrode, and wherein the second electrode comprises a p-type semiconductor material, the third longitudinal segment of the nanowire being structurally and electrically coupled to the second electrode.

6. The radiation-emitting device of claim 1, wherein the nanowire is configured to emit electromagnetic radiation having a wavelength within a range extending from about 400 nanometers to about 800 nanometers when a voltage is applied across the nanowire between the first electrode and the second electrode.

7. The radiation-emitting device of claim 1, wherein the nanowire comprises erbium or boron ions.

8. A radiation-emitting device comprising:
    a first electrode:
    a second electrode:
        at least one nanowire extending between the first electrode and the second electrode, the nanowire being structurally and electrically coupled to the first electrode and the second electrode, the nanowire comprising a double-heterostructure semiconductor device configured to emit electromagnetic radiation when a voltage is applied across the nanowire between the first electrode and the second electrode; and
        a resonant cavity, the nanowire being disposed within the resonant cavity.

9. The device of claim 8, wherein the resonant cavity is configured to resonate at least one wavelength of electromagnetic radiation within a range extending from about 300 nanometers to about 2,000 nanometers; and
    the nanowire is disposed within the resonant cavity, the nanowire comprising an active longitudinal segment comprising an active material, the active longitudinal segment being selectively disposed at a predetermined location within the resonant cavity, the active material being capable of emitting electromagnetic radiation at the at least one wavelength.

10. The device of claim 9, wherein the active longitudinal segment of the nanowire is selectively disposed at a predetermined location within the resonant cavity to maximize the energy within the resonant cavity when the nanowire is emitting electromagnetic radiation at the at least one wavelength.

11. The device of claim 9, wherein the resonant cavity comprises:
    a first substantially planar member having a reflectivity greater than zero with respect to the at least one wavelength of electromagnetic radiation emitted by the active longitudinal segment of the nanowire, and
    a second substantially planar member having a reflectivity greater than zero with respect to the at least one wavelength of electromagnetic radiation emitted by the active longitudinal segment of the nanowire.

12. The device of claim 11, wherein at least one of the first substantially planar member and the second substantially planar member has a reflectivity less than one hundred percent with respect to the at least one wavelength of electromagnetic radiation emitted by the active longitudinal segment of the nanowire.

13. The device of claim 11, wherein at least one of the first substantially planar member and the second substantially planar member comprises a Bragg mirror.

14. The device of claim 11, wherein at least one of the first substantially planar member and the second substantially planar member comprises a thin layer of reflective material.

15. The device of claim 9, wherein the resonant cavity is disposed within a photonic crystal.

16. The device of claim 9, wherein the active material comprises a material doped with erbium ions.

* * * * *

UNITED STATES PATENT AND TRADEMARK OFFICE
CERTIFICATE OF CORRECTION

PATENT NO. : 7,465,954 B2 Page 1 of 1
APPLICATION NO. : 11/413375
DATED : December 16, 2008
INVENTOR(S) : Theodore I Kamins et al.

It is certified that error appears in the above-identified patent and that said Letters Patent is hereby corrected as shown below:

In column 21, line 19, in Claim 1, delete "electrode:" and insert -- electrode; --, therefor.

In column 21, line 45, in Claim 2, after "both" insert -- a --.

In column 22, line 10, in Claim 8, delete "electrode:" and insert -- electrode; --, therefor.

In column 22, line 11, in Claim 8, delete "electrode:" and insert -- electrode; --, therefor.

Signed and Sealed this

Twenty-first Day of July, 2009

JOHN DOLL
*Acting Director of the United States Patent and Trademark Office*